United States Patent [19]

Okabe et al.

[11] Patent Number: 4,894,690

[45] Date of Patent: Jan. 16, 1990

[54] THIN FILM TRANSISTOR ARRAY INCORPORATING A SHORTED CIRCUIT BYPASS TECHNIQUE

[75] Inventors: Kazuya Okabe, Moriya; Hideyuki Matsuda, Iwaki; Yasuhiko Kasama, Izumi; Hiroyuki Hebiguchi, Sendai, all of Japan

[73] Assignee: Alps Electric Co., Ltd., Tokyo, Japan

[21] Appl. No.: 173,751

[22] Filed: Mar. 25, 1988

[30] Foreign Application Priority Data

Apr. 22, 1987 [JP] Japan .................................. 62-99175

[51] Int. Cl.[4] ...................... H01L 27/10; H01L 29/44
[52] U.S. Cl. ....................................... 357/4; 357/23.7; 357/45; 357/71
[58] Field of Search ....................... 357/4, 45, 71, 23.7

[56] References Cited

U.S. PATENT DOCUMENTS 4,673,969  6/1987  Ariizumi et al. ...................... 357/59
4,689,116  8/1987  Coissard et al. ......................... 357/4

FOREIGN PATENT DOCUMENTS 61-29820    2/1986  Japan ..................................... 357/4
61-214461   9/1986  Japan ..................................... 357/4
62-143469   6/1987  Japan ..................................... 357/4

Primary Examiner—Andrew J. James
Assistant Examiner—Jerome Jackson, Jr.
Attorney, Agent, or Firm—Guy W. Shoup; Paul J. Winters; Stephen L. Malaska

[57] ABSTRACT

A thin film transistor array includes a gate bus and a source bus intersecting with each other at right angles, a thin film transistor pair disposed adjacent to the intersecting point and electrically connected to the two buses. If a short circuit is detected between the two buses, the gate bus or the source bus is severed into a separate portions to eliminate the short circuit. A bypass bus is provided to electrically connect the electrically good severed portions and to the end terminal. Such a bypass bus avoids the need for additional power supply terminals to the opposite ends of the severed bus and facilitates driving the thin film transistor by supplying the power at only one end thereof.

2 Claims, 5 Drawing Sheets

THIN FILM TRANSISTOR ARRAY INCORPORATING A SHORTED CIRCUIT BYPASS TECHNIQUE

BACKGROUND OF THE INVENTION

1. Field of the Invention

The present invention relates to a thin film transistor array in which a pair of thin film transistors is disposed in parallel for each picture cell of a liquid crystal element for driving the latter in an active matrix condition. The array incorporates a structural bypass technique for circumventing shorts during the processing of the array without increasing the number of power supply terminals necessary to drive the array.

2. Prior Art

As illustrated in FIGS. 5 and 6, a known thin film transistor array having thin film transistors (referred to as TFT hereinbelow) disposed in pairs for each liquid crystal picture cell includes a substrate 1 of a glass, and a plurality of gate buses 2 and source buses 3 perpendicularly intersecting each other and disposed on the substrate, both of the buses being made of molybdenum. The gate bus 2 and the source bus 3 intersect each other at a cross-over point 4. The source bus 3 extends over the gate bus 2 and the two buses 2 and 3 are electrically insulated from each other by an insulation film 5 as shown in FIG. 5. The insulation film 5 is composed of two layers having a first insulation film member 6 of silicon nitride and a second insulation film member 8 of hydrogen amorphous silicon applied over the gate bus 2 as shown in FIG. 6. The second insulation film member 8 is formed simultaneously with a semiconductor film for TFT 7 shown in FIG. 5. A passivation film 9 shown in FIG. 6 extends on and over the entire upper surface of the substrate 1 covering the source bus 3 layer. The passivation film 9 is made of a material such as silicon nitride.

The gate bus 2 has a gate branch line 10 extending therefrom at a position near the cross-over point 4, and the source bus 3 has a pair of source branch lines 11, 11 both leading into the TFT 7 as shown in FIG. 5. Therefore, the TFT 7 is disposed adjacent to the cross-over point 4. The TFT 7 is a pair of TFT members each disposed perpendicular to the source bus 3 and parallel to the gate bus 2 and a picture cell electrode. The TFT pair share a common gate electrode, a pair of source electrodes, a pair of drain electrodes and a common semiconductor film. Either one or both of the TFT pair drives one picture cell of the liquid crystal display element. The TFT 7 is fabricated with a gate insulation film and a semiconductor film disposed over the common gate electrode. The gate insulation film is disposed at the same time the first insulation film member 6 is disposed over the gate bus for the crossover point 4. The semiconductor film is disposed over the gate insulation film member at the same time the semiconductor film 12 and the second insulator member 8 of the crossover point 4 are formed. Disposed on the semiconductor film of the TFT are the two source electrodes formed of aluminum simultaneously with the source bus 3 and the two drain electrodes. The passivation film 9 shown in FIG. 6 is disposed on and over the electrodes. The TFT 7 further includes a light shield 13 made of aluminum, for instance, which is disposed on and over the other components.

The thin film transistor array of such a construction has a drawback in that a short circuit in the array takes place almost inevitably due to various physical defects created during the manufacturing process thereof. Namely, a short circuit could occur at the cross-over point 4 where the gate bus 2 and the source bus 3 intersect with each other, or between the gate electrode and the source electrode of the TFT, for example. A short circuit defect results in a linear or a spot linear defect of the liquid crystal display element, thereby deteriorating its display characteristics.

To this end, it is customary to take measures to repair the short-circuited portion for eliminating the liner or the spot picture defect. A conventional repair method is performed as follows. Before the final passivation film 9 is applied to the substrate, an isolation test is performed between one terminal G1 of the gate bus 2 and one terminal S1 of the source bus 3 to verify if a short has developed between the gate bus 2 and the source bus 3. If a short circuit is detected therebetween, the source bus 3 being the upper layer bus, is severed by means of a laser beam at a position a in FIG. 5 located between the two source bus branch lines 11. Laser trimming can be accomplished using a YAG laser. Once position a on the source bus is opened, a second isolation test is performed between the terminal G1 of the gate bus 2 and the terminal S1 of the source bus 3. If a short circuit remains evident therebetween, the source bus 3 is severed at a position b in FIG. 5, located between one source branch line 11 and the cross-over point 4. The cut at position b will open any short circuit, if any, developed at a point A on the TFT 7 in FIG. 5. The isolation test is repeated between the two terminals G1 and S1, and if a short is detected therebetween, the source bus 3 is severed at a position c in FIG. 5 located between the cross-over point 4 and the terminal S1 of the source bus 3. This step in the repair process serves to cut off a short circuit, if any, developed at a point B, indicated in FIG. 5, on the cross-over point 4. If the second and subsequent isolation tests prove that there exists no short between the Terminal G1 of the gate bus 2 and the terminal S1 of the source bus 3, the isolation test is performed between the terminal G1 of the gate bus 2 and the other terminal S2 of the source bus 3. If a short is detected therebetween, the TFT 7 may be shorted at a point C in FIG. 5. The source bus 3 is severed at a position d in FIG. 5. Following this sequence of isolation tests, any short circuit developed at points A, B and C in FIG. 5, are completely disconnected from the source bus 3. Therefore, the short is detected during fabrication and eliminated prior to driving the liquid crystal display element of the final product. In this way, power can be supplied to the member of the TFT pair and thus avoids the subsequent occurrence of spot picture defects, because it rarely occurs that both of the TFT members are short-circuited simultaneously. The above-described repair is followed by application of the passivation film 9 over the entire surface of the substrate 1 and then the light shield 13 over the TFT 7 component.

According to the conventional repairing method described above, each end of the source buses 3 needs to have power-supplied from the opposite end terminals S1 and S2 which doubles the number of required power supply terminals necessary. Further the power supply terminals are located often too close to each other which creates a potential for a short circuit therebetween. Moreover, if a short circuit is detected at more than two points on source bus 3, the power cannot be supplied to any portions disposed between the short-circuited points. Finally, if shorts are detected at points which are located relatively remote from each other, a series of spot picture defects will develop in succession and thus often lead to a quasi-linear picture defect.

SUMMARY OF THE INVENTION

According to a first aspect of the present invention, a thin film transistor array comprises:

a substrate;

a plurality of gate buses disposed on the substrate;

a plurality of source buses disposed on the substrate and intersecting the gate buses at cross-over points;

a plurality of thin film transistors each disposed on the substrate adjacent to each cross-over point and connected to the gate bus and the source bus the thin film transistors being provided in pairs to drive each liquid crystal element and disposed parallel to each other; and a plurality of bypass buses disposed over the length of the source buses and the gate buses in which the source buses or the gate buses have any number of short circuit points which have been severed open using a laser beam the bypass in electrically connecting the electrically good severed portions of the source or gate buses through contact holes.

According to a second aspect of the present invention, a method of manufacturing a thin film transistor array is comprised of:

providing a plurality of gate buses and source buses intersecting with each other at cross-over points on a substrate, and also a plurality of thin film transistors such that each transistor is disposed on the substrate at a position adjacent to each cross-over point and connected to the gate bus and the source bus, and the transistors being parallel and in pairs to drive each liquid crystal element;

verifying whether a short circuit has developed between each associated pair gate and source buses and the associated transistor pair and then if detected, the short circuit is severed open between any TFT pair and gate and source buses, into separate bus portions using a laser beam for example, to scribe open the bus;

providing a passivation film on and over the gate buses and the source buses on the substrate whereby contact holes are defined therethrough; and providing a plurality of bypass buses each bridging over the separate bus portions of the gate bus or the source bus for thereby electrically connecting the good bus portions to each other through said contact holes.

According to the present invention, the gate or source bus is severed by a laser beam to eliminate a short circuit before the passivation film is applied. Then a bypass bus is disposed over said passivation film to bridge across the severed parts of the bus and connect the good bus portions to each other. The bypass bus eliminates the need for two power supply terminals for each bus severed in order to drive the liquid crystal display element. The bypass bus can supply the power to a TFT disposed between two short-circuited points where the conventional method could not. Furthermore, incorporating a bypass bus does not increase the number of process steps in the manufacture of the TFT array if the bypass bus is disposed simultaneously with the light layer to the array.

It is therefore an object of the present invention to provide a method of repairing a short circuit developed on a gate bus or a source bus in a thin film transistor array such that a power supply to only one end terminal of the bus suffices for driving the liquid crystal display element.

Another object of the present invention is to provide a thin film transistor array which is repairable with utmost ease by the present method.

Many other advantages, features and additional objects of the present invention will become manifest to those versed in the art upon making reference to the detailed description and the accompanying drawings in which preferred embodiments incorporating the principles of the present invention is shown by way of illustrative example.

DETAILED DESCRIPTION

Figure 1:
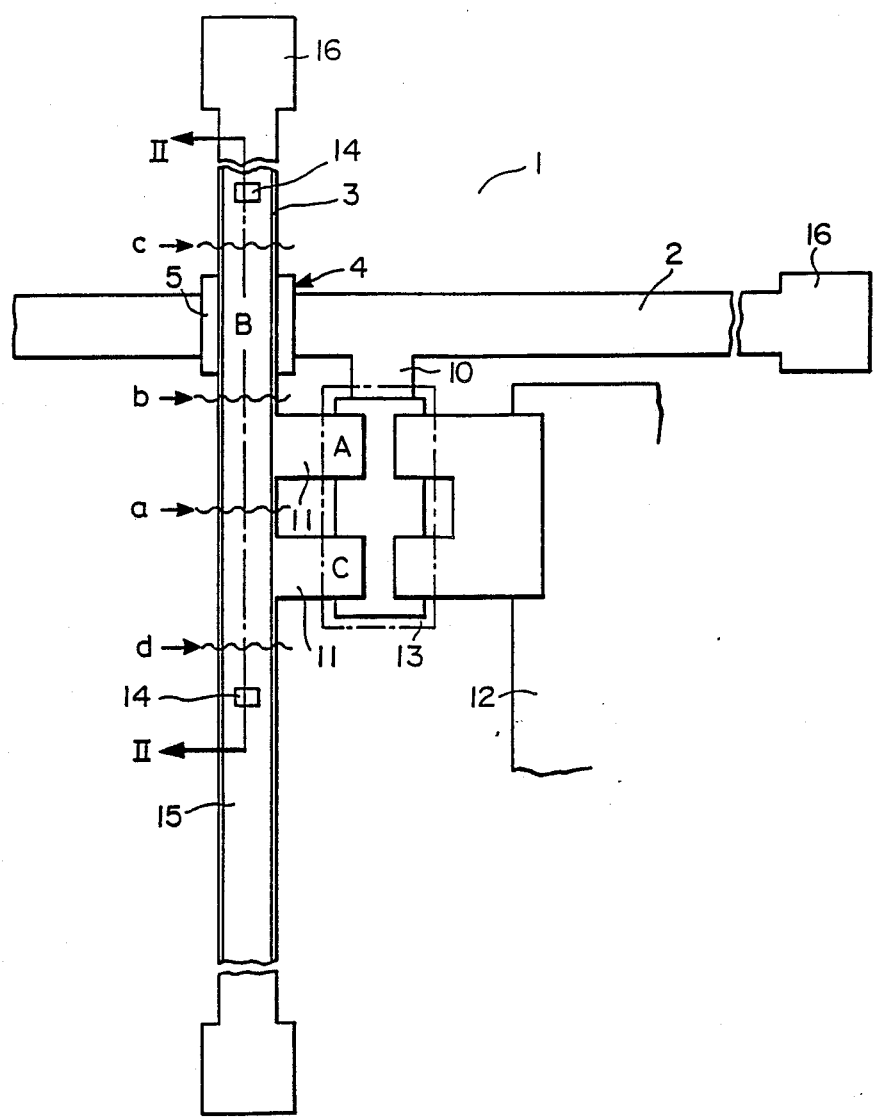
FIG. 1 is a schematic plan view of a primary part of a TFT array according to a first embodiment of the present invention.
Figure 2:
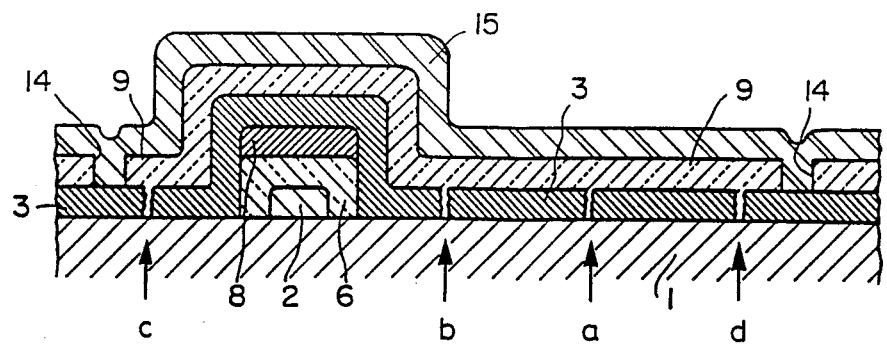
FIG. 2 is a vertical cross-sectional view taken along line II—II of FIG. 1.
Figure 5:
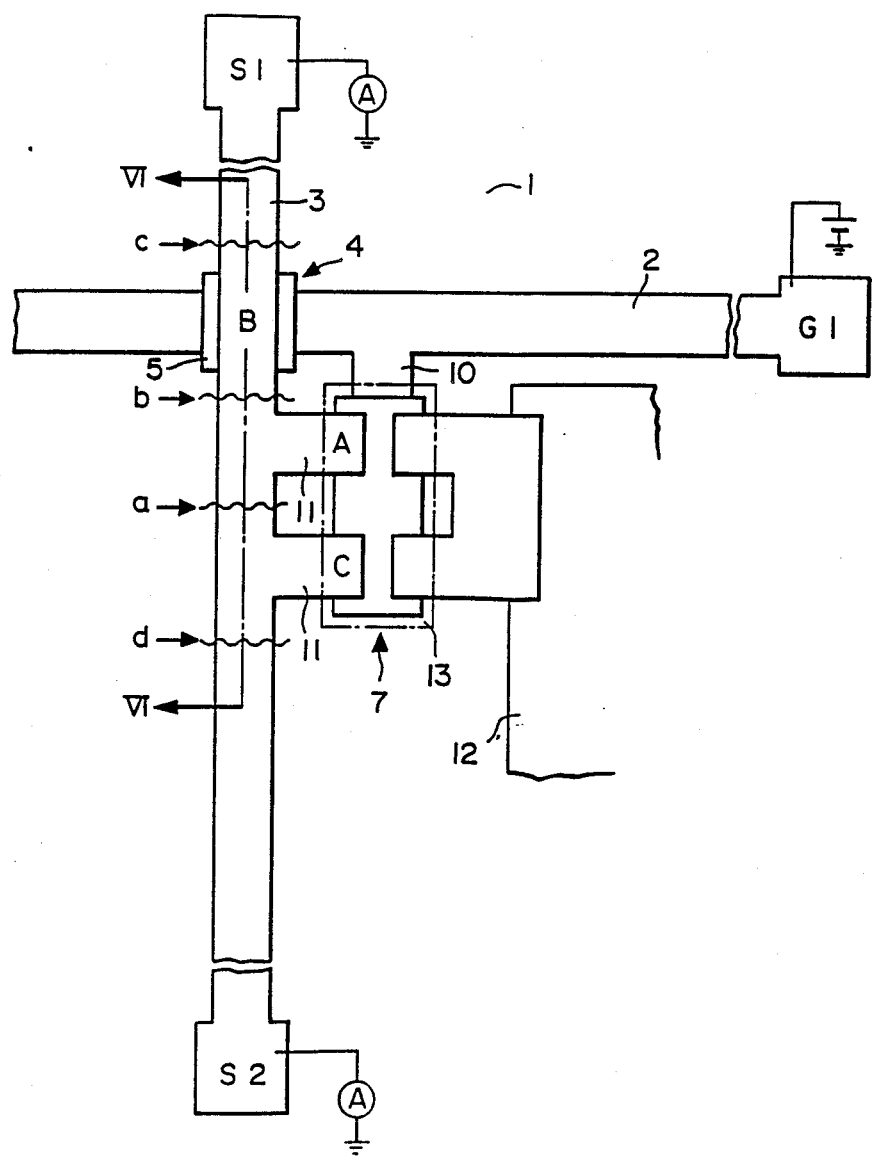
FIG. 5 is a schematic plan view of a primary part of the conventional TFT array.
Figure 6:
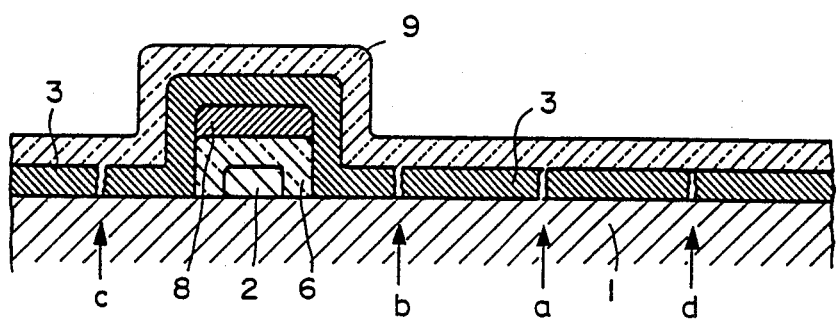
FIG. 6 is a vertical cross-sectional view taken along line VI—VI of FIG. 5.

FIGS. 1 and 2 show a thin film transistor array (TFT array) according to a first embodiment of the present invention. The TFT array includes a substrate 1, a plurality of gate buses 2, a plurality of source buses 3, the gate and the source buses intersecting with each other at respective cross-over points 4 and being insulated from each other by an insulation film 5, and a plurality of TFTs disposed adjacent to the cross-over points 4 and connected to the adjacent gate and source buses. FIGS. 1 and 2 illustrate only one pair of the gate and the source buses 2 and 3, and one TFT 7. The TFT array of the invention, as illustrated in FIG. 1, has a similar construction to that of the TFT array of the prior art, illustrated in FIG. 5, except in that a bypass bus 15 is disposed on the passivation film 9, shown in FIG. 2, and is connected to the source bus 3 through contact holes 14, 14, the source bus 3 having been severed open at suitable positions using a laser beam for example a YAG laser, in order to connect the electrically good source bus portions to each other and terminal 16.

More particularly, the source bus 3 is severed at positions a, b, c and d, in FIG. 1, into several portions and then the passivation film 9 is disposed over the entire upper surface of the substrate 1, the passivation film 9 being made of silicon dioxide ($SiO_2$), for instance. The contact holes 14, 14 are formed through the passivation film 9 layer to the source bus 3 layer at a position located between one end terminal 16 of the source bus 3 and the severed position c, and the other at a position located between the other source bus end terminal and the severed position d, both contact holes being located closer to the ends of the bus, for example. The contact holes 14 are opened to make contact between the source bus layer and the exterior of the passivation film 9. Then a light shield made of aluminum, for instance, is applied onto the passivation film 9 to extend over a semiconductor film 12 of the TFT 7. Simultaneously the bypass bus 15 is disposed on the passivation film 9 to extend parallel to and along the source bus 3 which underlies the passivation film 9. The bypass bus 15 is in the form of an elongate strip of a conductive material, and is electrically connected through the contact holes 14, 14 to the severed source bus portions. The bypass bus 15 can be made whatever length necessary to span the shorted severed bus portions and connect the electrical good portions to terminal 16 in FIG. 1.

Figure 3:
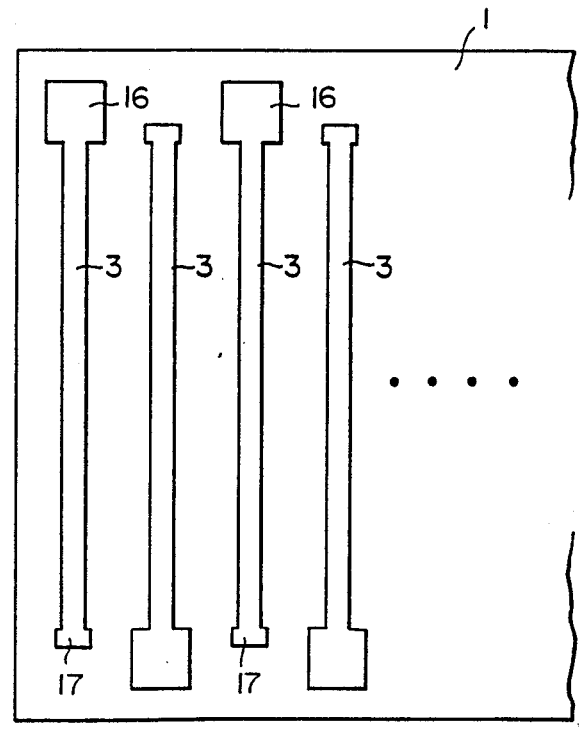
FIG. 3 is a schematic plan view of power-supply terminals.

With this arrangement of the bypass bus 15, the thin film transistor array of the present invention enjoys a suitable electrical connection between the severed electrically good bus portions and one power supply terminal, for example terminal 16. The conventional method requires power to be supplied to both end terminals of the severed bus because this method lacks the means to make suitable connection such as the bypass bus 15 in the present invention. The one terminal power supply requirement of the present invention makes it possible to decrease by half the number of power supply terminals which must be conventionally formed on the opposite end thereof. FIG. 3 shows the source buses 3 having power supply terminals 16 formed only at one ends thereof and small isolation test pads 17 formed on the other ends. The source buses 3 are arranged such that the power supply terminals 16 and the isolation test pads 17 are located alternately. This arrangement enables optimization of power supply terminal size and the spacing between them and the insulation test pads 17, facilitating a isolation therebetween.

If the short circuit is detected at more than two points on the source bus the power can be fed to any TFT disposed between the short-circuited points to enable proper functioning of the liquid crystal display. Spot picture defects associated with the conventional method of repair are eliminated, resulting in improved production yield of the TFT arrays.

Figure 4:
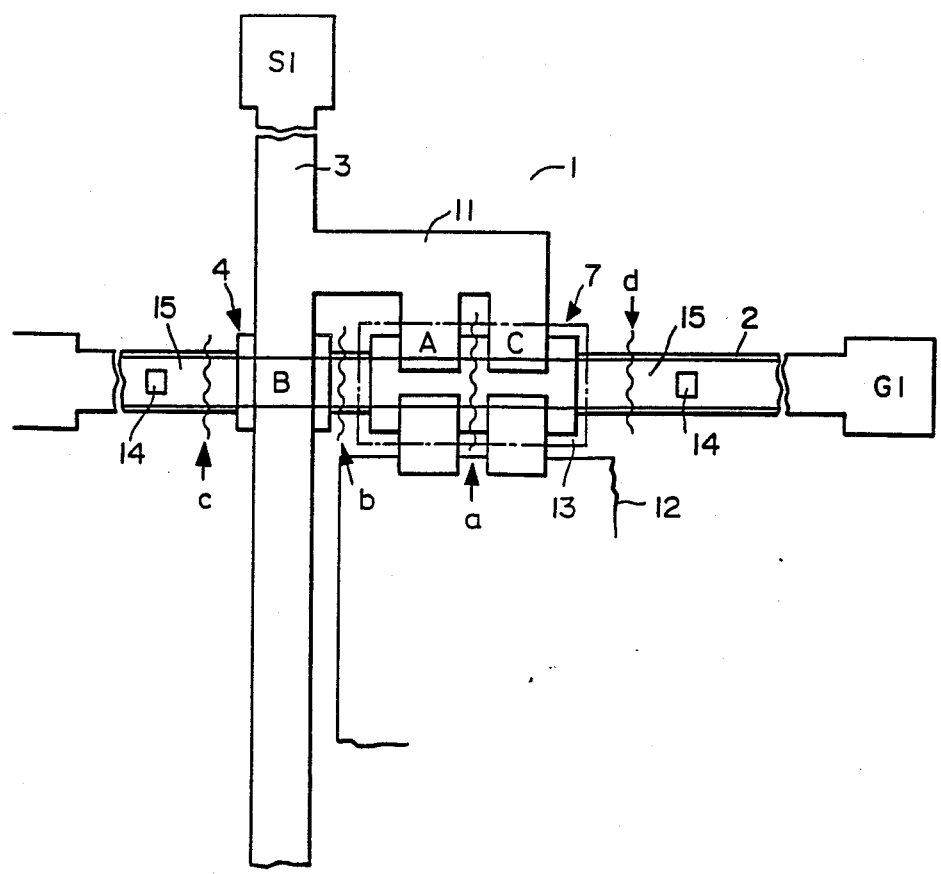
FIG. 4 is similar to FIG. 1, showing a primary part of the TFT array according to a second embodiment of the invention.

FIG. 4 shows a TFT array according to a second embodiment of the present invention, in which the bypass bus is disposed over the gate bus 2 to bridge severed portions of the gate bus 2 and connect electrically good portions to the end terminal G1.

In this embodiment, only one pair of the gate and the source buses 2 and 3 in one TFT 7 are illustrated. The source bus branch 11 extends out perpendicularly to and turns parallel with the main source bus 3 line. The gate bus 2 runs parallel to the main source branch 11 but underneath the TFT, providing a common gate to the TFT pair. The TFT pair is disposed parallel to the source bus 3 in this embodiment. The source branch line 11 is at a position between source bus terminal S1 and the cross-over point 4. A pair of contact holes 14, 14 are disposed on the gate bus 2 in a similar manner to the first embodiment, namely, at two positions located one between terminal G1 of the gate bus 2 and severed position d and the other between the opposite end of the gate bus 2 and severed position c. A bypass bus 15 in the form of an elongate strip is disposed on the passivation film 9 to extend parallel to the gate bus 2 to electrically connect through the two contact holes 14 the electrically good severed gate bus portions to terminal G1.

In the above-described embodiments, the source bus 3 overlaps the gate bus 2 at the cross-over point 4. However, the principle of the present invention may be applied similarly to a TFT array in which the source bus extends below the gate bus at a cross-over point and the lamination pattern of the source terminals, the drain terminals and the gate terminal is in the reverse order. In any case, the bypass bus 15 is disposed over the passivation layer 9 to extend parallel with either the gate bus or the source bus and connects the electrically good severed bus portions to the end terminal.

With this arrangement of the invention, a short circuit developed in the source bus or the gate bus of the TFT array is eliminated without increasing the number of power supply terminals necessary to drive the TFT. The electrically good severed bus portions are electrically connected by the bypass bus, to an end terminal, and therefore does not increase the required number of power supply terminals needed. The bypass bus is disposed over passivation film simultaneously with the application of the light shield layer so does not increase the number of the manufacturing steps Such one terminal power supply makes it possible to decrease by half the number of power supply terminals which have been conventionally formed on the opposite ends thereof. This arrangement also allows for a power supply terminals of a relatively large size and maximum interspacing between the terminals of the adjacent buses, which facilitates the insulation therebetween. Further, if the short circuit is established at more than two points on a gate or source bus, the power can be fed to any TFT disposed between the short-circuited points using the bypass bus technique, thereby preventing a spot picture defect which otherwise might occur. Thus, improved yield in the production of the TFT arrays results.

Although various minor modification may be suggested by those versed in the art, it should be understood that I wish to embody the scope of the patent warranted herein, all such embodiments as reasonably and properly come within the scope of my contribution to the art.

What is claimed is:

1. A thin film transistor array comprising:
   a substrate;
   a first plurality of buses disposed on the substrate;
   a second plurality of buses disposed on the substrate and intersecting said first plurality of buses at cross over points;
   a plurality of thin film transistors grouped in pairs, each transistor of the pair being parallel to point and connected to a bus of said first plurality thereof and a bus of said second plurality thereof for driving a liquid crystal display;
   a bypass bus disposed along a bus of said first and second pluralities thereof;
   a passivation layer disposed between said bypass bus and said bus of said first and second pluralities thereof, the bypass bus contacting said bus of said first and second pluralities thereof through contact holes, wherein said contact holes are defined through said passivation layer at predetermined locations, whereby in the event of an electrical short developing in the contacted bus between said contact holes, a portion of said contacted bus between said contact holes may be severed, with the bypass bus providing connection to the remaining portions of said contacted bus through said contact holes.

2. A thin film transistor array according to claim 1, wherein said portion of said contacted bus between said contact holes is severable by a laser beam.

* * * * *